United States Patent [19]

Marum

[11] Patent Number: 5,506,742
[45] Date of Patent: Apr. 9, 1996

[54] CIRCUITRY AND STRUCTURES FOR ELECTROSTATIC DISCHARGE PROTECTION

[75] Inventor: Steven E. Marum, Sherman, Tex.

[73] Assignee: Texas Instruments Incorporated, Dallas, Tex.

[21] Appl. No.: 129,619

[22] Filed: Sep. 30, 1993

Related U.S. Application Data

[62] Division of Ser. No. 954,134, Sep. 30, 1992, Pat. No. 5,268,588.

[51] Int. Cl.$^6$ ............................................. H02H 9/04
[52] U.S. Cl. ........................... 361/56; 361/91; 361/111
[58] Field of Search ............................. 361/56, 111, 91, 361/18, 58

[56] References Cited

U.S. PATENT DOCUMENTS

| | | | |
|---|---|---|---|
| 5,196,981 | 3/1993 | Kuo | 361/56 |
| 5,335,132 | 8/1994 | DeShazo, Jr. | 361/59 |
| 5,400,202 | 3/1995 | Metz et al. | 361/56 |

*Primary Examiner*—Todd Deboer
*Attorney, Agent, or Firm*—Alan K. Stewart; Richard L. Donaldson; William E. Hiller

[57] ABSTRACT

Circuitry (10) and structures (30) are provided for electrostatic discharge protection. A first bipolar transistor (Q1) has a collector electrically coupled to a first node (12), a base electrically coupled to a second node, and an emitter electrically coupled to a third node (14). A second bipolar transistor (Q2) has a collector, a base electrically coupled to the second node, and an emitter electrically coupled to the first node (14). The second bipolar transistor (Q2) supplies a base current to the base of the first bipolar transistor (Q1) in response to the first node (12) reaching a threshold voltage relative to the third node (14), so that the first bipolar transistor (Q1) conducts current between the first (12) and third (14) nodes in response to the base current.

12 Claims, 3 Drawing Sheets

5,506,742

CIRCUITRY AND STRUCTURES FOR ELECTROSTATIC DISCHARGE PROTECTION

This is a division of application Ser. No. 07/954,134 filed Sept. 30, 1992 now Pat. No. 5268588

TECHNICAL FIELD OF THE INVENTION

This invention relates in general to electronic circuitry, and in particular to circuitry and structures for electrostatic discharge protection.

BACKGROUND OF THE INVENTION

Input protection circuitry is an important area of electronic technology. Extremely small delicate device structures are very sensitive to high voltages which may be developed by an electrostatic discharge ("ESD") from a human body. When an electronic circuit is installed into a part, such an electrostatic discharge may destroy the part or reduce the part's quality or capacity. For example, an electrostatic discharge may develop an extremely high voltage which quickly destroys the thin gate oxides and short channel devices of high density complimentary metal oxide semiconductor ("CMOS") field effect transistor circuits.

Previous techniques have been developed for dissipating electrostatic discharges in order to avoid such negative effects. However, typical previous techniques have very high threshold trigger voltages. A high threshold trigger voltage is frequently insufficient to adequately protect certain devices on the electronic circuit, such as an n-channel field effect transistor. Some previous techniques for lowering threshold trigger voltages nevertheless present alternative problems, such as occupation of a large amount of semiconductor fabrication area.

Thus, a need has arisen for circuitry and structures for electrostatic discharge protection, which have low threshold trigger voltages. Also, a need has arisen for circuitry and structures for electrostatic discharge protection, which protect field effect transistors. Moreover, a need has arisen for circuitry and structures for electrostatic discharge protection, which occupy a small amount of semiconductor fabrication area.

SUMMARY OF THE INVENTION

In circuitry and structures for electrostatic discharge protection, a first bipolar transistor has a collector electrically coupled to a first node, a base electrically coupled to a second node, and an emitter electrically coupled to a third node. A second bipolar transistor has a collector, a base electrically coupled to the second node, and an emitter electrically coupled to the first node. The second bipolar transistor supplies a base current to the base of the first bipolar transistor in response to the first node reaching a threshold voltage relative to the third node, so that the first bipolar transistor conducts current between the first and third nodes in response to the base current.

It is a technical advantage of the present invention that circuitry and structures are provided for electrostatic discharge protection, which have low threshold trigger voltages.

It is another technical advantage of the present invention that circuitry and structures are provided for electrostatic discharge protection, which protect field effect transistors.

It is a further technical advantage of the present invention that circuitry and structures are provided for electrostatic discharge protection, which occupy a small amount of semiconductor fabrication area.

BRIEF DESCRIPTION OF THE DRAWINGS

For a more complete understanding of the present invention, and the advantages thereof, reference is now made to the following descriptions taken in conjunction with accompanying drawings, in which.

DETAILED DESCRIPTION OF THE INVENTION

The preferred embodiment of the present invention and its advantages are best understood by referring to FIGS. 1–6 of the drawings, like numerals being used for like and corresponding parts of the various drawings.

Figure 1:
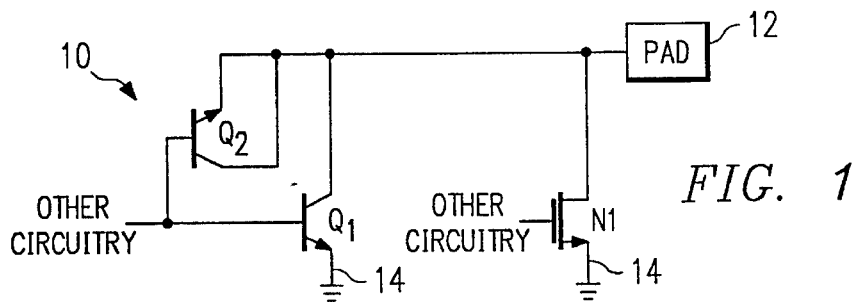
FIG. 1 is an electrical schematic diagram of circuitry for electrostatic discharge protection, according to a first exemplary embodiment of the present invention.

FIG. 1 is an electrical schematic diagram of circuitry, indicated generally at 10, for electrostatic discharge protection, according to a first exemplary embodiment of the present invention. A drain of an n-channel field effect transistor N1 is connected to an output pad 12. A source of transistor N1 is connected to a voltage reference node 14. The gate of transistor N1 is connected to other circuitry of a device to be protected against an ESD pulse at output pad 12.

Output pad 12 is further connected to a collector of an npn bipolar transistor Q1, a collector of an npn bipolar transistor Q2, and an emitter of transistor Q2. An emitter of transistor Q1 is connected to voltage reference node 14. A base of transistor Q1 is connected to a base of transistor Q2 and to other circuitry of the device to be protected against the ESD pulse. Alternatively, the collector of transistor Q2 can be floating.

Transistor N1 has a typical breakdown voltage from drain to source ("BVds") of approximately 6.9-8 volts. By comparison, transistor Q1 has a higher breakdown voltage of approximately 12–15 volts. In a significant aspect of the present invention, transistor Q2 operates as a reverse biased emitter-base junction. During an ESD pulse at output pad 12, transistor Q2 advantageously breaks down and provides drive current to the base of transistor Q1, even before the voltage at output pad 12 reaches the 12–15 volt breakdown voltage of transistor Q1.

By providing drive current in this manner from transistor Q2 to the base of transistor Q1, almost all of the high ESD current flows from output pad 12 through transistor Q1 instead of transistor N1. Since maximum current of transistor Q1 is at least approximately 5–6 amperes, transistor Q1 is undamaged by conducting the high current from the ESD pulse, which typically is approximately 1.3 amperes for a 2-kV Human Body Model ("HBM") test. Moreover, transistor Q1 begins conducting before a large voltage overshoot at output pad 12 that might otherwise be necessary to break down transistor Q1. Such a large voltage overshoot might also occur with previous techniques that rely on capacitive triggering derived from fast dv/dt of the ESD pulse. It is a technical advantage of the present invention that circuitry 10 is insensitive to dv/dt of the ESD pulse.

Figure 2:
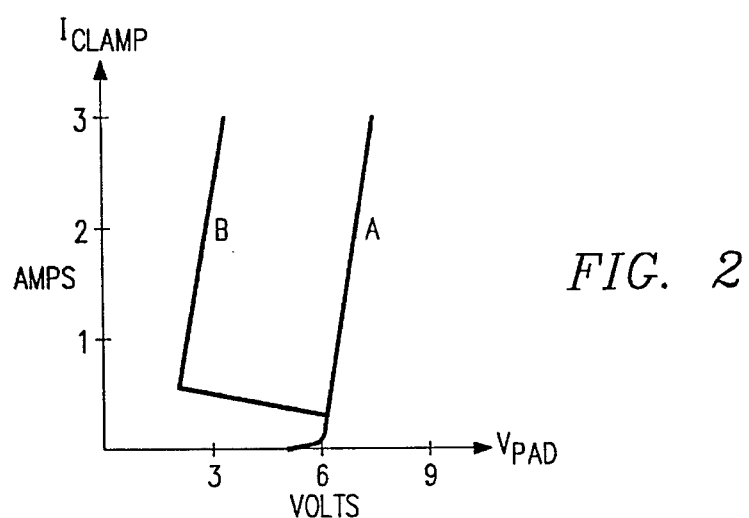
FIG. 2 is a graph of current versus voltage characteristics of circuitry for electrostatic discharge protection, according to the present invention.

Without transistor Q2, during the ESD pulse transistor N1 could break down and conduct before transistor Q1, because transistor N1 has a lower breakdown voltage than transistor Q1. In that situation, output pad 12 could be substantially clamped at a low voltage insufficient to break down transistor Q1. By failing to break down transistor Q1, almost all of the 1.3 ampere ESD current could flow through transistor N1 instead of transistor Q1. Since maximum current of transistor N1 can be as low as approximately 0.1–0.2 amperes, such a large ESD current would almost certainly overheat transistor N1, so that transistor N1 would be destroyed by a drain to source short under its polysilicon layer. FIG. 2 is a graph of current ("$I_{CLAMP}$") through transistor Q1 as a function of voltage ("$V_{PAD}$") at output pad 12. Notably, transistor Q2 is substantially turned off while the voltage at output pad 12 is within a normal operating voltage range. In a BiCMOS circuit, the normal operating voltage range is up to approximately 5.5 volts. Referring to curve "A" in response to the voltage at output pad 12 reaching $BVeb_{Q2}+Vbe_{Q1} \approx 5.5+0.8 \approx 6.3$ volts, transistor Q2 provides drive current to the base of transistor Q1, where $BVeb_{Q2}$ is the breakdown voltage from emitter to base of transistor Q2, and where $Vbe_{Q1}$ is the voltage from base to emitter of transistor Q1. Accordingly, in response to the voltage at output pad 12 reaching approximately 6.3 volts, transistor Q1 substantially clamps the voltage at output pad 12 at a level below the BVds of transistor N1. Since transistor N1 has a typical BVds of approximately 6.9–8 volts, transistor Q1 protects transistor N1 by conducting almost all of the 1.3 ampere ESD current.

Curve "A" shows that, as current through transistor Q1 increases, the voltage at output pad 12 gradually increases due to resistance in circuitry 10. Eventually, current through transistor Q1 could increase to the point where the voltage at output pad 12 reaches the BVds of transistor N1. As illustrated by curve "B" of FIG. 2, better ESD protection is afforded if the voltage at output pad 12 initially decreases in response to transistor Q1 beginning to conduct. By initially decreasing the voltage at output pad 12 in response to transistor Q1 beginning to conduct, curve "B" advantageously allows higher current through transistor Q1 before the voltage at output pad 12 eventually reaches the BVds of transistor N1.

Figure 3:
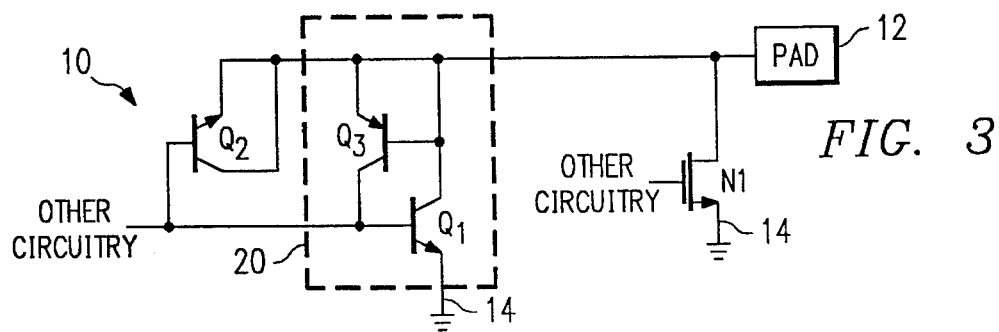
FIG. 3 is an electrical schematic diagram of circuitry for electrostatic discharge protection, according to a second exemplary embodiment of the present invention.

For achieving the characteristics of curve "B" of FIG. 2, circuitry 10 is modified to further include a pnp bipolar transistor Q3 as shown in FIG. 3. A base and an emitter of transistor Q3 are connected to the collector of transistor Q1. A collector of transistor Q3 is connected to the base of transistor Q1. Together, transistors Q1 and Q3 form a silicon controlled rectifier ("SCR"), indicated by dashed enclosure 20.

Referring to curve "B" of FIG. 2 and circuitry 10 of FIG. 3, in response to the voltage at output pad 12 reaching $BVeb_{Q2}+Vbe_{Q1} \approx 5.5+0.8 \approx 6.3$ volts, transistor Q2 provides drive current to the base of transistor Q1, such that SCR 20 begins to conduct. As illustrated by curve "B" of FIG. 2, after SCR 20 begins to conduct, the voltage at output pad 12 quickly decreases to $Von_{Q3}+Vbe_{Q1} \approx 0.2-0.4+0.8 \approx 1.0-1.2$ volts (or alternatively, $Veb_{Q3}+Von_{Q1} \approx 0.8+0.2-0.4 \approx 1.0-1.2$ volts), where $Von_{Q3}$ is the voltage from emitter to collector of transistor Q3, and where $Vbe_{Q1}$ is the voltage from base to emitter of transistor Q1. Advantageously, the holding current of SCR 20 is relatively high (approximately 0.5 amperes), such that output pad 12 substantially avoids latching during normal circuit operation.

Figure 4:
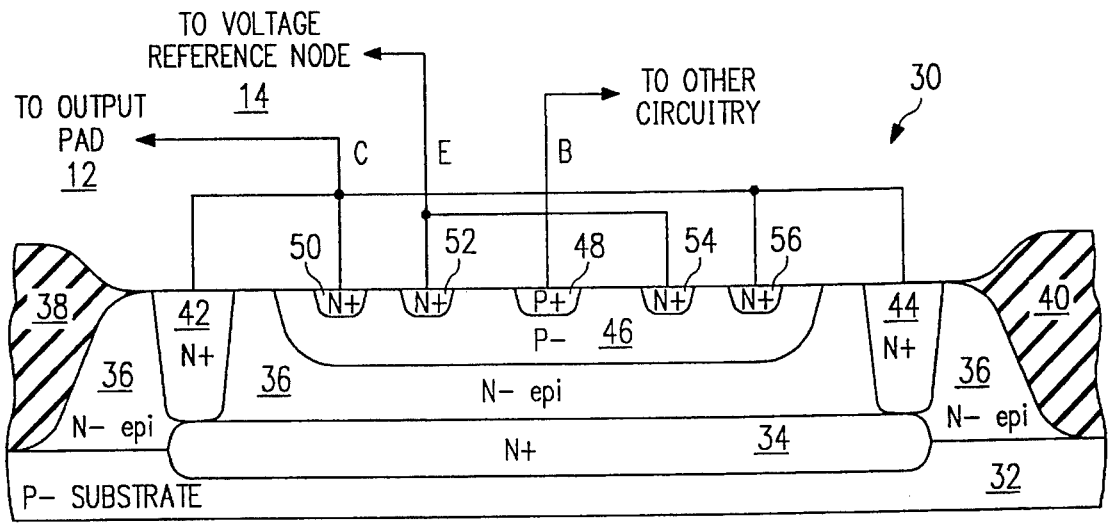
FIG. 4 is a sectional view of a structure for electrostatic discharge protection, according to the circuitry of FIG. 1.

FIG. 4 is a sectional view of a structure 30 for electrostatic discharge protection, according to circuitry 10 of FIG. 1. Advantageously, structure 30 occupies a small amount of semiconductor fabrication area, in part because transistor Q1 operates as both an output device and an ESD clamp. In forming structure 30, a heavily doped N+ buried layer 34 is patterned and formed in a lightly doped P– substrate 32. After forming N+ buried layer 34, a lightly doped N– type epitaxial semiconductor layer 36 is grown over N+ buried layer 34 and uncovered areas of P– substrate 32.

Then, a hard mask oxide (not shown) is deposited, patterned and etched to define regions in which to grow thick LOCOS field silicon dioxide ("field oxide") regions 38 and 40. Alternatively, field oxide regions 38 and 40 can be formed of other suitable insulative material besides silicon dioxide. After growing field oxide regions 38 and 40 and stripping the hard mask oxide, heavily doped N+ regions 42 and 44 are patterned and formed in N– type epitaxial semiconductor layer 36 either by diffusion or by implantation, self-aligned to field oxide regions 38 and 40, respectively, so as to contact N+ buried layer 34. As shown in FIG. 4, a lightly doped P– well 46 is patterned and implanted in N– type epitaxial semiconductor layer 36. A heavily doped P+ region 48 and heavily doped N+ regions 50, 52, 54 and 56 are patterned and formed in P– well 46, either by diffusion or by implantation.

The emitter of transistor Q1 is provided by N+regions 52 and 54. The base of transistor Q1 is provided by P– well 46 together with P+ region 48. The collector of transistor Q1 is provided by N– type epitaxial semiconductor layer 36 together with N+ buried layer 34 and N+ regions 42 and 44.

The emitter of transistor Q2 is provided by N+regions 50 and 56. The base of transistor Q2 is provided by P– well 46 together with P+ region 48. The collector of transistor Q2 is provided by N– type epitaxial semiconductor layer 36 together with N+ buried layer 34 and N+ regions 42 and 44.

In FIG. 4, metal contacts to semiconductor regions are shown only schematically for clarity. N+ regions 42, 44, 50 and 56 are electrically contacted to output pad 12. N+ regions 52 and 54 are electrically contacted to voltage reference node 14. P+ region 48 is electrically contacted to other circuitry of the device to be protected against the ESD pulse. Accordingly, structure 30 interfaces externally in the same manner as transistor Q1.

Figure 5:
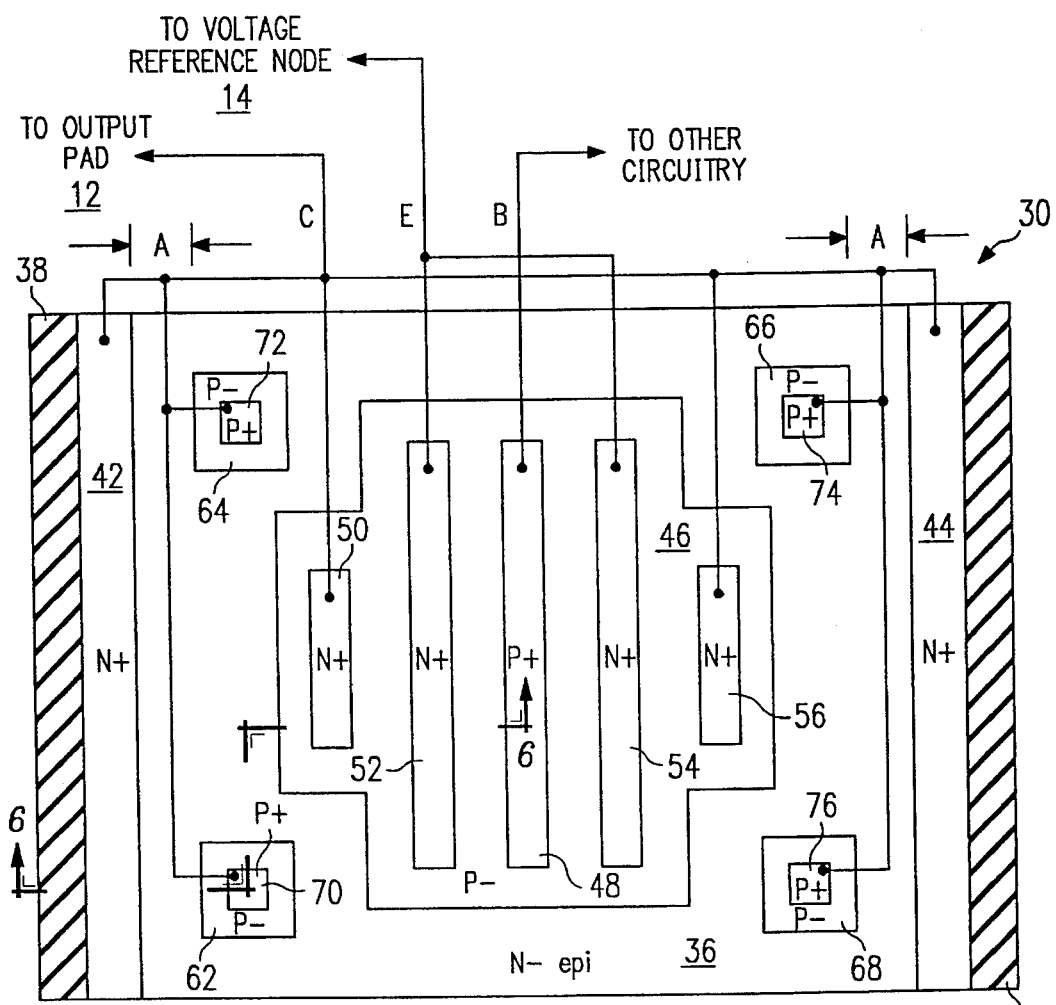
FIG. 5 is a plan view of a structure for electrostatic discharge protection, according to the circuitry of FIG. 3.
Figure 6:
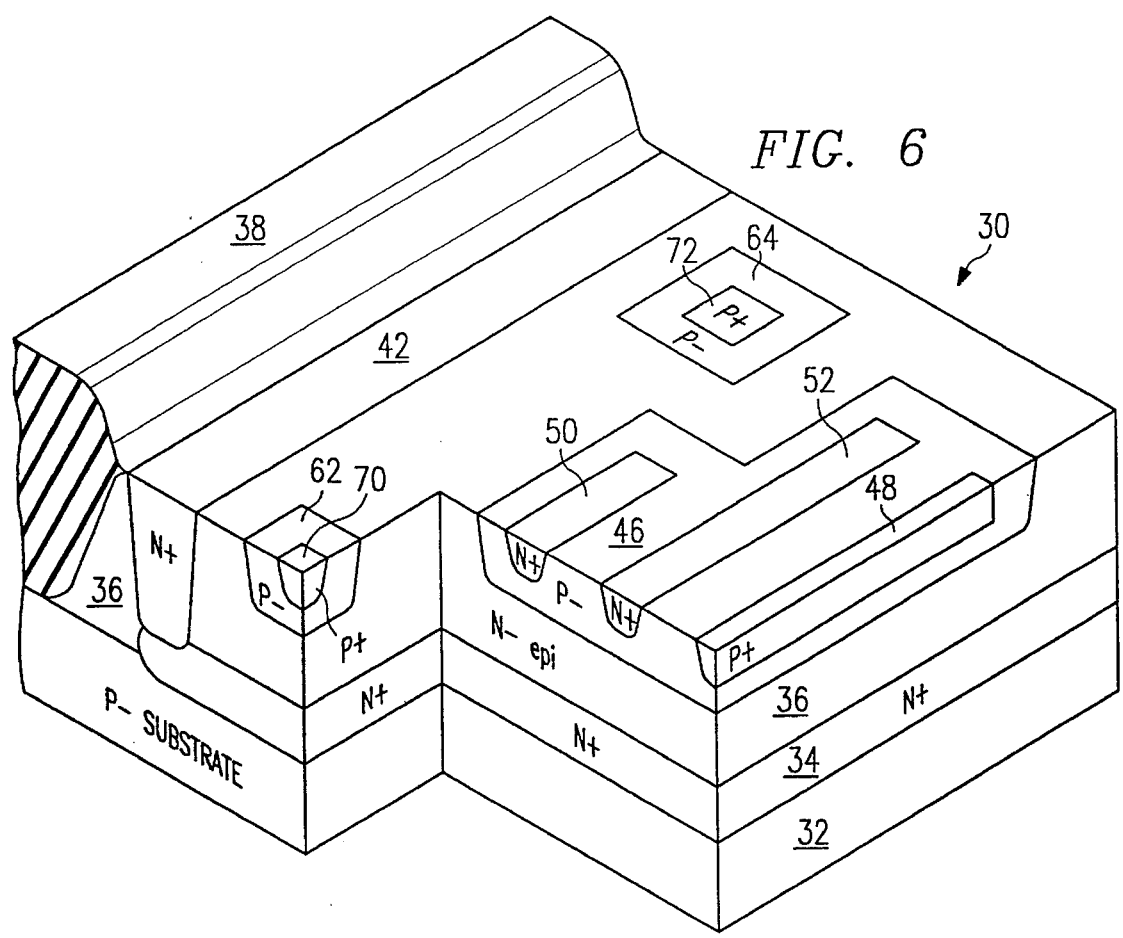
FIG. 6 is a perspective view of the structure of FIG. 5, taken substantially along line 6—6 in FIG. 5.

For achieving the characteristics of curve "B" of FIG. 2 according to circuitry 10 as shown in FIG. 3, structure 30 is modified as shown by the plan view in FIG. 5. FIG. 6 is a perspective view of structure 30 of FIG. 5, taken substantially along line 6—6 in FIGURE 5. As shown in FIGS. 5 and 6, lightly doped P– regions 62, 64, 66 and 68 are patterned and formed in N– type epitaxial semiconductor layer 36. Heavily doped P+ regions 70, 72, 74 and 76 are patterned and formed in P– regions 62, 64, 66 and 68, respectively.

The emitter of transistor Q3 is provided by P–regions 62, 64, 66 and 68, together with P+ regions 70, 72, 74 and 76. The base of transistor Q3 is provided by N– type epitaxial semiconductor layer 36 together with N+ buried layer 34 and N+ regions 42 and 44. The collector of transistor Q3 is provided by P– well 46 together with P+ region 48. Notably, holding current can be adjusted by varying spacing "A". As spacing "A" decreases, holding current increases.

In FIG. 5, metal contacts to semiconductor regions are shown only schematically for clarity. P+ regions 70, 72, 74 and 76 are electrically contacted to output pad 12, as are N+ regions 42, 44, 50 and 56. As in FIG. 4, structure 30 as shown in FIGS. 5–6 interfaces externally in the same manner as transistor Q1.

In FIGS. 4–6, transistor Q2 is readily incorporated into a preexisting structure for transistor Q1 by forming N+ regions 50 and 56 and electrically contacting them to N+ regions 42 and 44. In the preexisting structure for transistor Q1, the metal contact to N+ regions 42 and 44 is already relatively wide to conform with current carrying rules. Accordingly, the incorporation of transistor Q2 into such a preexisting structure does not significantly increase semiconductor fabrication area.

Also, in FIGS. 5–6, transistor Q3 is readily incorporated into the preexisting structure for transistor Q1 by forming P– regions 62, 64, 66 and 68, together with P+ regions 70, 72, 74 and 76. In the preexisting structure for transistor Q1, N+ regions 42 and 44 are already larger than minimum layout rules to accommodate the relatively wide metal contact which carries normal operating current of transistor Q1. P– regions 62, 64, 66 and 68, and P+ regions 70, 72, 74 and 76 are readily formed beneath this preexisting wide metal contact and are readily contacted thereto. Accordingly, the incorporation of transistor Q3 into such a preexisting structure does not significantly increase semiconductor fabrication area.

Moreover, the preexisting large size of N+ regions 42 and 44 advantageously diminishes resistance of SCR 20, since the base of transistor Q3 and the collector of transistor Q1 are both provided by N+ regions 42 and 44, together with N+ buried layer 34 and N– type epitaxial semiconductor layer 36.

Notably, the emitter of transistor Q3 is provided by four separate P– regions 62, 64, 66 and 68 (together with P+ regions 70, 72, 74 and 76), and the emitter of transistor Q2 is provided by N+ regions 50 and 56 which are significantly shorter than N+ regions 52 and 54. With these arrangements as shown in FIGS. 5–6, the emitter of transistor Q3 is more proximately located near the emitter of transistor Q1 (provided by N+ regions 52 and 54), advantageously resulting in more interaction between transistors Q1 and Q3 forming SCR 20.

Although the present invention and its advantages have been described in detail, it should be understood that various changes, substitutions and alterations can be made therein without departing from the spirit and scope of the invention as defined by the appended claims.

What is claimed is:

1. Circuitry for electrostatic discharge protection, comprising:

a first npn bipolar transistor having a collector electrically coupled to a first node, a base electrically coupled to a second node, and an emitter electrically coupled to a third node;

a second npn bipolar transistor having a collector, a base electrically coupled to said second node, and an emitter electrically coupled to said first node, such that said second bipolar transistor supplies a base current to said base of said first bipolar transistor in response to said first node reaching a threshold voltage relative to said third node, so that said first bipolar transistor conducts current between said first and third nodes in response to said base current; and a pnp bipolar transistor having an emitter electrically coupled to said first node, a base electrically coupled to said first node, and a collector electrically coupled to said second node.

2. The circuitry of claim 1 wherein said second bipolar transistor operates as a reverse biased emitter-base junction for breaking down and providing said base current in response to said first node reaching said threshold voltage.

3. The circuitry of claim 1 wherein said threshold voltage is lower than a breakdown voltage of said first bipolar transistor.

4. The circuitry of claim 3 and further comprising an n-channel field effect transistor having a gate, a first source/drain region electrically coupled to said first node, and a second source/drain region electrically coupled to said third node, said threshold voltage being lower than a breakdown voltage of said n-channel field effect transistor between said first and second source/drain regions.

5. The circuitry of claim 4 wherein said breakdown voltage of said first bipolar transistor is higher than said breakdown voltage of said n-channel field effect transistor.

6. The circuitry of claim 1 wherein said first node is electrically coupled to an output pad.

7. The circuitry of claim 1 wherein said second node is electrically coupled to circuitry to be protected against an electrostatic discharge.

8. The circuitry of claim 7 wherein said threshold voltage is higher than a normal operating voltage of said circuitry to be protected.

9. The circuitry of claim 1 wherein said third node comprises a voltage reference node.

10. The circuitry of claim 1 wherein said collector of said second bipolar transistor is floating.

11. The circuitry of claim 1 wherein said collector of said second bipolar transistor is electrically coupled to said first node.

12. The circuitry of claim 1 wherein said first bipolar transistor and said pnp bipolar transistor together for a silicon controlled rectifier, such that a voltage at said first node initially decreases in response to said first bipolar transistor beginning to conduct current between said first and third nodes.

* * * * *